United States Patent [19]
Brasch et al.

[11] Patent Number: 6,009,342
[45] Date of Patent: Dec. 28, 1999

[54] IMAGING METHOD FOR THE GRADING OF TUMORS

[75] Inventors: Robert C. Brasch, Mill Valley, Calif.; Heike E. Daldrup, Münster, Germany; David M. Shames, Berkeley, Calif.

[73] Assignee: The Regents of the University of California, Oakland, Calif.

[21] Appl. No.: 09/032,357

[22] Filed: Feb. 27, 1998

Related U.S. Application Data

[60] Provisional application No. 60/039,216, Feb. 28, 1997.

[51] Int. Cl.$^6$ .................................................. A61B 5/055
[52] U.S. Cl. ........................... 600/420; 600/431; 424/9.3; 424/9.33
[58] Field of Search .................................... 600/420, 431; 436/63, 64, 173; 424/9.3, 9.33

[56] References Cited

FOREIGN PATENT DOCUMENTS

WO 94/27498   8/1994   WIPO .

OTHER PUBLICATIONS

Robert A. McGuire, et al., "Maternal, fetal and amniotic fluid transport of thyroxine, triidothyronine, and iodide in sheep: a kinetic model," *Endocrinology* 103(2):567–576 (1978).
Marc D. Ogan, Ph.D., et al., "Albumin labeled with Gd–DTPA an intravascular contrast–enhancing agent for magnetic resonance blood pool imaging: preparation and characterization," *Invest. Radiol.* 22:665–671 (1987).
Udo Schmiedl, M.D., et al., "Magnetic resonance imaging of myocardial infarction using albumin–(Gd–DTPA), a macromolecular blood–volume contrast agent in a rat model," *Invest. Radiol.* 22(9):713–721 (1987).
V. Le Doussal, M.D., et al., "Prognostic value of histologic grade nuclear components of Scarff–Bloom–Richardson (SBR)," *Cancer* 64(9):1914–1921 (1989).
George Stoica, et al., "ENU–induced in vitro neoplastic transformation of rat mammary epithelial cells," *Anticancer Res.* 11(5):1783–1792 (1991).
Noel Weidner, M.D., et al., "Tumor angiogenesis and metastasis—correlation in invasive breast carcinoma," *N. Engl. J. Med.* 324(1):1–8 (1991).
Charles A. Belfi, Ph.D., et al., "The response of the KHT sarcoma to radiotherapy as measured by water proton NMR relaxation times: relationships with tumor volume and water content," *Int. J. Oncology Biol. Phys.* 20:497–507 (1991).
David M. Shames, et al., "Measurement of capillary permeability to macromolecules by dynamic magnetic resonance imaging: a quantitative noninvasive technique," *Magn. Res. in Med.* 29:616–622 (1993).
Ryohei Kuwatsuru, et al., "Quantification of tissue plasma volume in the rat by contrast–enhanced magnetic resonance imaging," *Magn. Res. in Med.* 30:76–81 (1993).
P. Bevilacqua, et al., "Prognostic value of intratumoral microvessel density, a measure of tumor angiogenesis, in node–negative breast carcinoma—results of a multiparametric study", *Breast Cancer Res. and Treatment* 36:205 (1995).
Noel Weidner, "Intratumor microvessel density as a prognostic factor in cancer," *Am. J. Pathol.* 147(1):9–19 (1995).

(List continued on next page.)

*Primary Examiner*—Ruth S. Smith
*Attorney, Agent, or Firm*—Townsend and Townsend and Crew LLP

[57]   ABSTRACT

The endothelial integrity of microvessels is disturbed in malignant tumors. We invented a method wherein we used MRI to define tumor microvascular permeabilities and correlated these permeabilities with histologic grade in tumors. Using macromolecular MRI contrast medium, we discovered tumor microvascular permeability values were significantly lower in benign tumors than in carcinomas. In addition, we found that the microvascular permeability values demonstrated a strong correlation with the histologic grade of carcinomas as determined by the Scarff-Bloom-Richardson grading system.

23 Claims, 4 Drawing Sheets

OTHER PUBLICATIONS

John G. Strugar, M.D., et al., "Vascular endothelial growth/permeability factor expression in human glioma specimens: correlation with vasogeni brain edema and tumor–associated cysts," *J. Neurosurg.* 83:682–689 (1995).

Heidi C. Schwickert, M.D., et al., "Contrast–enhanced MR imaging assessment of tumor capillary permeability: effect of irradiation on delivery of chemotherapy," *Radiology* 198:893–898 (1996).

R.C. Brasch, "What is angiogenesis and why image it?", *Diagnostic Imaging* xx:73–(1996).

Cornelis F. van Dijke, M.D., et al., "Mammary carcinoma model: correlation of macromolecular contrast–enhanced MR imaging characterizations of tumor microvasculature and histologic capillary density," *Radiology* 198:813–818 (1996).

IMAGING METHOD FOR THE GRADING OF TUMORS

CROSS REFERENCE TO RELATED APPLICATIONS

This Application claims priority to U.S. Provisional Application Ser. No. 60/039,216, filed Feb. 28, 1997, which is hereby incorporated by reference.

FEDERALLY SPONSORED RESEARCH AND DEVELOPMENT

Not Applicable.

BACKGROUND OF THE INVENTION

I. Histological Grading of Tumors

Prior to this invention, grading of some tumors, particularly of the breast, has been done by microscopic examination. In grading breast tumors, pathologists have traditionally used the Scarff-Bloom-Richardson system (see, Le Doussal, V., et al., *Cancer* 64(9):1914 (1989)). Although the S-B-R grading of tumors was an attempt at objective quantitation, microscopic tumor grading, by its nature, is subjective. Additionally, to grade tumors, the tumor or the cells from a tumor need to be removed. This requires surgical techniques.

Because of the subjective nature of tumor grading, the same pathologist should grade all the tumors. In addition, the pathologist should be well-trained in the grading of tumors by the S-B-R system. Alternatively, two pathologists can be used and the results obtained by each compared for consistency (Robbins, P., et al., *Hum. Pathol.* 26(8):873 (1995)).

Tumors can be graded histopathologically on many different bases. As mentioned above, for malignant breast tumors, grading systems such as S-B-R are preferred because they provide objective values of malignancy grade. The pathologist using the S-B-R system looks to three structural characteristics when grading tumors: (1) nuclear pleomorphism; (2) mitotic index; and (3) the ability of the tumor to form tubular, glandular or capillary formations, ie., ductoglandular differentiation (see, Le Doussal, supra). Tumors are graded by each criterion separately with I being the most normal (differentiated) and 3 the most aberrant (undifferentiated). The scores of the three criteria are added for a final tumor grade. Therefore, the scores can range from 3–5 (well differentiated) to 6–7 (moderately differentiated) and 8–9 (poorly differentiated).

II. Tumor Angiogenesis

Angiogenesis is the process by which new vessels grow toward and into a tissue. Angiogenesis is required for several physiologic processes including embryogenesis, corpus luteum formation, and wound healing. It is also a critical element in the pathogenesis of many disorders, most notably rapid growth and metastasis of solid tumors. With the current evolution of new strategies and drugs to intervene in the angiogenesis process, a complete understanding of angiogenesis has become clinically important.

The formation of new blood supplies is essential to the unrestricted growth of tumors. Tumors do not produce their own new blood vessels, but for nutrients and oxygen rely on vascular supplies derived from the nearby host tissue. It has been shown that tumors can attain a size of only 1–2 mm by simple diffusion of nutrients, but can exist for an extended period in this quiescent, static, prevascular stage before angiogenesis is "switched on" (Folkman, J., *J. Nat'l Cancer Inst.* 82:4 (1989)). Once angiogenesis is upregulated, the tumor enters the vascular phase allowing for exponential growth and resultant clinical manifestations. Although the mechanism of "switching on" is not known, once the switch has been thrown, angiogenic factors elaborated by the tumor and tumor-associated inflammatory cells interact with endothelial cells in neighboring capillaries to stimulate new capillary beds and to prepare the local environment for their ingrowth.

Being a limiting factor for both tumor growth and metastases, it has been assumed that angiogenesis correlates with tumor aggressiveness. This assumption has been supported in clinical trials investigating a variety of tumor types. Histologic assays of angiogenesis based on the microvascular density (MVD), ie., the number of endothelial clusters in a high-power microscopic field, in randomly selected human breast cancers showed that MVD correlated, as an independent factor, with the presence of metastases at time of diagnosis and with decreased patient survival times (Weidner, N., et al., *N. Engl. J. Med.* 324:1 (1991); Weidner, N., *Am. J. Pathol.* 147:9 (1995)).

However, histologic/pathologic grade is distinguished from angiogenic activity or from the more generic characteristic of tumor aggressiveness. Thus, functional characteristics, such as angiogenesis, and structural characteristics, such as markers of histologic grade, are considered independent tumor prognostic factors. See, Weidner, N., (1995), supra and Bevilacqua, P., et al., *Breast Cancer Res. and Treatment* 36:205 (1995) (intratumoral microvessel density is weakly associated with histological grade (P=0.053)).

II. Magnetic Resonance Imaging

The magnetic resonance imaging (MRI) scan is a diagnostic tool which is currently the most sensitive non-invasive way of imaging soft tissues of the body. Unlike a CT scan or conventional X-ray, this type of scanning device does not use radiation; instead, it makes use of magnetic fields which interact with the hydrogen atoms found in the water contained in all body tissues and fluids. Computers translate the increased energy of the hydrogen nuclei into cross-sectional images. The scanning procedure is very sensitive, and can often detect tumors that would be missed on a CT scan.

To increase the sensitivity of MRI as well as CT scans, contrast media are used. A contrast agent is typically a substance that is introduced into the body and accumulates preferentially in some tissues. In MRI, when a contrast agent comes in contact with the tissue, it changes the proton relaxation rate of the tissue. The magnetic resonance signals from those tissues can, therefore, be altered relative to other tissues with a lesser affinity to the contrast agent and become more visible by MRI.

Although "macromolecular MRI contrast media" (MMCM) have been known to those of skill for some time, see, Ogan, M.D., et al., *Invest. Radiol.* 22:665 (1987), these media only recently have found diagnostic uses. See, Kuwatsuru, R., et al., *Magn. Reson. Med.* 30:76 (1993). These media typically contain chelated gadolinium groups conjugated to proteins, such as albumin. These types of contrast agents, because they do not cross healthy blood vessel walls, have allowed investigators to gauge the endothelial permeability of tumor vessels compared to the permeability of vessels in healthy tissues.

III. Imaging of Tumors and Histopathological Grading

Herein, we describe a quantitative method to estimate the microvascular permeability of tumors, more particularly breast tumors, by macromolecular contrast media imaging (MCMI). We have previously shown that increased microvascular permeability correlates closely with increased microvascular density, a histologic surrogate of angiogenesis (van Dijke, C. F., et al., *Radiology* 198:813 (1996). Thus MCMI of tumors can be used to estimate the vascular permeability of tumors without the need for biopsy and angiogenic histologic evaluation.

Surprising results of this invention are the discoveries that microvascular permeability of tumors as measured by MCMI correlates with the determination of malignancy or non-malignancy and the S-B-R histological grading of malignant tumors. As stated above, microvascular density has not been thought to be a prognosticator of tumor grade and therefore malignancy. See, Weidner and Bevilacqua, supra. Thus, one of skill would not look to measuring angiogenesis or its surrogates by MCMI to predict the malignancy of tumors. However, as described below, tumor permeability as measured by MCMI correlated well ($r^2 \geq 0.75$) with S-B-R histology.

Because MCMI is a non-invasive technique and affords the possibility to grade inaccessible tumors, it is a powerful diagnostic in an oncologist's tool chest. In addition, this technique could find wide clinical application both for routine tumor evaluation (both for initial diagnosis and for follow-up) and for the conduct of clinical trials of new anticancer therapeutic agents.

SUMMARY OF THE INVENTION

This invention provides for a novel method of grading tumors for malignancy and the degree of malignancy from the microvascular permeability of the tumor as measured by imaging. Briefly, a MCM is administered to an animal suspected of having a tumor. The tumor is imaged over time and the change in signal intensity in the tumor and blood is obtained to generate dynamic signal intensity responses from both the tumor and the blood. Dynamic signal intensity responses are then fitted to a kinetic model to calculate tumor microvascular permeability. From a standard curve of microvascular permeabilities of differing grades of tumors, the grade of the imaged tumor is extrapolated.

In this invention, we have used MCMI to measure microvascular permeability as a surrogate for histopathologic tumor grading. It is known that tumor microvessels are "leaky" to macromolecules which can pass through the endothelial barrier of the vessels and accumulate in the tumor interstitium.

As an experimental protocol, we injected rats with a carcinogen that preferentially induces mammary tumors. We imaged the tumors by MRI and then examined the tumors by the S-B-R method. We found that high microvascular permeability values calculated by MRI values correlated well with high S-B-R values and vice versa ($r^2 \geq 0.75$). The probability of correlation for microvascular permeability measurements compared to malignancy was less than 0.05.

Also embodied in this invention is a system for using MCMI to image tumors and grade them accordingly. The system would be based on an algorithm used to assign grey scale values according to the microvascular permeability values to the elements of the tumor. Grey values could be assigned to the regions of interest and the tumor visualized. A comparison of the grey scale image could then be made to previously obtained image-controls which had been already correlated with histopathologic grades of tumors. In this manner, the image of the tumor could be used to determine the histopathologic grade of the tumor without histological examination.

The system can be incorporated into a kit which could include a MCM and instructions on how to use and the proper imaging conditions. It is also envisioned that the kit would contain a computer software program which incorporates the algorithm of the system.

An aspect of this embodiment is a linear regression analysis of the slope of permeability of macromolecular contrast media in tissue, which may contain a tumor, and blood. If the slope is greater in the tissue, a pathological condition is implied, including but not limited to, the presence of a tumor in the imaged tissue. In addition to a difference in slope, we have found that the degree of difference in the slopes is proportional to the degree of malignancy or pathology in the tissue. To create a model that indicates the degree of malignancy, the slopes of permeability are analyzed and a null hypothesis of no difference in the slopes is assumed. If the null hypothesis is rejected, the reciprocal of the confidence level is calculated and presented as a simple grey scale superimposed on the image. Thus, the more unlikely the null hypothesis (i.e., the more malignant the tumor) in a given pixel or group of pixels, the more intense the brightness assigned to that pixel.

DEFINITIONS

Figure 1:
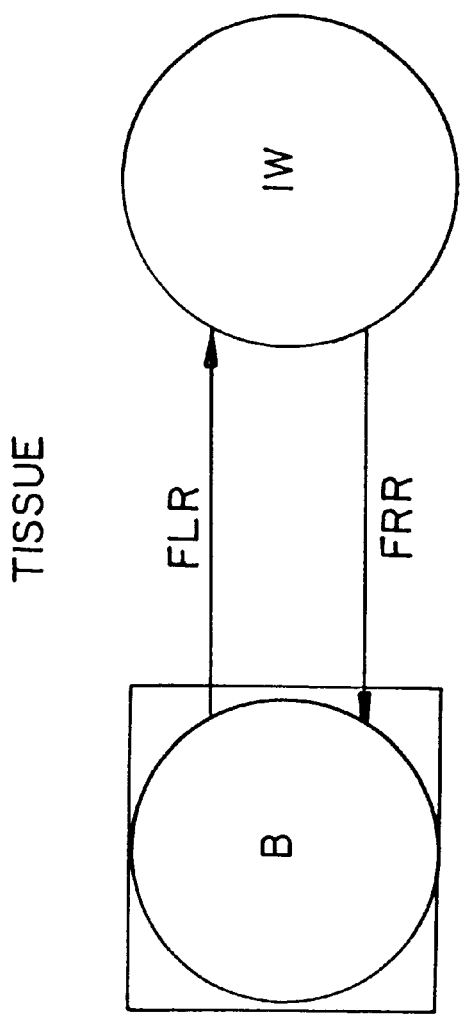
FIG. 1 represents a model used to determine the $\Delta R_1$ data obtained from blood and tumor. The kinetics of Gd disappearance from the blood following bolus intravenous injection of albumin-(Gd-DTPA)$_{35}$ can be described by a single compartment (IVC) with a fractional turnover rate of k (m$^{-1}$) and initial condition (IC). The tumor/tissue model is composed of two compartments, tissue blood (B) and tissue interstitial water (IW). This model describes the kinetics of fractional transport of albumin-(Gd-DTPA)$_{35}$ from B to IW, designated FLR for fractional leak rate (m$^{-1}$), and from IW to B, designated FRR for fractional reflux rate (m$^{-1}$). The blood compartment of the tissue is shown as a circle inside of a box signifying that the response in the IVC multiplied by a proportionality constant, the fractional blood volume (fBV) of the tissue.
Figure 1:
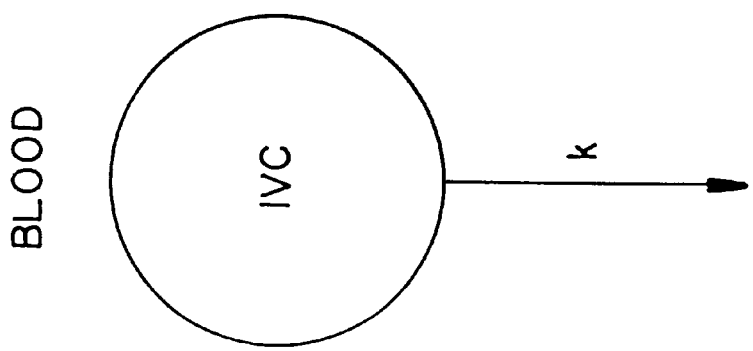

"Accumulation of macromolecular contrast medium in the tumor" refers to the leaking of macromolecular contrast medium from the tumor microvasculature into the interstitial space of the tumor and the amount remaining in the microvessels.

"Animal" refers to any vertebrate, preferably a mammal, including humans.

"Capillary permeability surface area product" (PS) refers to a measurement of tumor vasculature permeability. PS≈(PV)(FLR$_{in}$), where PV is the plasma volume and FLR$_{in}$ is the fractional leak rate of MMCM from the plasma to interstitial water of the tissue. PS can also be determined from a computer generated model.

"Chelating groups" refers to compounds that bind to metal atoms, rendering them less likely to bind to other compounds, particularly biological compounds. Chelating agents are frequently used to reduce the toxicity of a metal.

"Contrast media" refers to compounds that can be used to resolve adjacent tissues which are similar when imaging but histologically or physiologically different.

"Dynamic signal intensity response" refers to a profile generated by multiple images demonstrating the change of signal intensity over time.

"Grading a tumor" refers to the process of determining whether a tumor is benign or malignant and if malignant, determining the degree of malignancy.

"Grey scale" and "Assigning a grey scale" refers to converting the data obtained from an image to a shade of grey. Typically, the greater the number, the paler the color.

"Histopathologic grade of tumor" refers to the grade of a tumor given by an pathologist after microscopically examining a portion of the tumor.

"Imaging" refers to a method of examining tissue by exposing the tissue to energetic waves and measuring the differences in absorption of the energy transmitted or by measuring the release of energy by the tissues in the presence of the energetic waves. Contemplated imaging methods include but are not limited to: magnetic resonance imaging; computerized tomography scanning; positron emission tomography scanning; radionuclide scanning; conventional X-ray and ultrasound imaging.

"Interstitial space of a tumor" refers to the area between cells in a solid tumor exclusive of vascular spaces.

"Kinetic model" refers to a mathematical algorithm which, when data from the images over time are entered, determines the value of physiologic parameters including the microvascular permeability of the tumor.

"Linear regression analysis" refers to a method of estimating and setting confidence intervals for parameters involved in expressing a linear trend in a population. The basic assumptions underlying this method are: (1) the values of the independent variables are fixed; (2) $\mu_{Y|x}=A+Bx$; (3) for each x, the variance of the distribution of Y is the same and equal to $v^2$; and (4) the random variables representing the response variable are independently distributed. After the parameters A, B, $\mu_{Y|x}$, and $v^2$ are determined, confidence intervals for these parameters are determined and a hypothesis regarding these parameters is tested. Typically, the test is the null hypothesis, wherein B is equal to 0.

"Macromolecular contrast media" refer to contrast media with molecular weights of greater than 30 kD or with smaller molecular weights yet retaining the effective molecular sizes of a 30 kD peptide. This can be effected by the binding of smaller contrast media, after injection, to larger molecules within the body, particularly albumin.

"Macromolecular MRI contrast media" refers to macromolecular contrast media that when injected into an animal being subjected to MRI, increases the contrast between tissues based on the differential relaxation rates of the tissues.

"Magnetic resonance imaging" refers to a method of examining interior soft tissues in situ. The subject is placed in a continuous magnetic field. A transverse radio-frequency (r-f) pulse is applied and the spins of the protons in the sample are perturbed from equilibrium. As the protons return to equilibrium, they lose energy to the surrounding environment and this loss of energy is visualized by MRI.

"Microvascular permeability" refers to the ability of solutes to traverse the endothelial barrier of microvessels. It has been established that the microvessels of tumors are particularly "leaky" and permeability is high compared to non-turnorous vessels.

"Pixel" refers to the smallest region of interest that can be examined and individually processed in a visual display system.

"Region of interest(ROI)" refers to the area within an image determined by the operator for analysis.

"Relaxation rates" refers to the reciprocal of the respective relaxation times ($T_1$ and $T_2$).

"Scarff-Bloom-Richardson histological grading of tumors" refers to determining the grade of malignancy based on three criteria: (1) the pleomorphism of the nucleus; (2) the mitotic index; and (3) ductoglandular formation.

"Signal intensity" refers to the brightness of imaged tissue. The brighter the tissue, the higher the signal intensity. In MRI, the signal intensity can be manipulated by weighting the image. In a $T_1$-weighted image, nuclei with a higher $T_1$ appear brighter.

"Spin echo" refers to an MRI response created by sequentially imposing two r-f pulses of different amplitudes: first, a 90° r-f pulse, then a 180° pulse. After exposure to the 90° pulse, the nuclei wobble around the longitudinal axis (same direction as the constant external magnetic field) in phase and lose coherence quickly due to local field inhomogeneities of the external field and internal magnetic fields in the substance. If the direction of the net transverse magnetization is now reversed by exposure to a 180° pulse, a different MRI signal called the "spin echo" will result.

"Standard curve of permeability values" refers to a statistically significant standard curve of microvascular permeability values versus grade of tumors. It is generated by comparing the microvascular permeability values obtained for tumors and comparing them to the histopathological grade of the tumor.

"Tumor" refers to a benign or malignant mass of cells including the central mass and the tumor rim. The tumor rim is the edge of the tumor where the tumor cells are most likely to be alive and dividing. The center of a solid tumor can be a necrotic mass of cells and therefore grading of the central tumor mass may not be indicative of the malignancy of the tumor at the time the tumor is graded.

"$T_1$ weighted" refers to the process by which an image is obtained that demonstrates signal contrast that is based on $T_1$ differences. This can be done by maximizing $T_1$ and minimizing $T_2$ differences.

DETAILED DESCRIPTION OF THE INVENTION

The following sections provide a detailed explanation of the invention and how to practice the invention. We explain first how to select and administer a macromolecular contrast medium (MCM). We then give an overview of the methods for imaging the change over time of the signal intensities of a tumor and blood to obtain dynamic signal intensity responses for these tissues. We then explain how to apply the responses to a kinetic model to calculate tumor microvascular permeability. Finally, we explain how to determine the histopathologic grade of the tumor from a standard curve of permeability values.

I. Selection and Administration of Contrast Agents

Contrast media can be used for resolving adjacent tissues which are similar upon imaging but histologically or physiologically different, and in functional studies of organs such as the kidney. Several classes of compounds have been explored as potential contrast agents. For MRI, these classes include superparamagnetic iron oxide particles, nitroxides, and paramagetic metal chelates. See, Mann J. S. and Brasch R. C. in HANDBOOK OF METAL-LIGAND INTERACTIONS IN BIOLOGICAL FLUIDS: BIORGANIC MEDICINE VOL. 2, Berthon, G., ed., Marcel Dekker, Inc., New York, N.Y. (1995). For CT scans, these classes include iodinated hydrocarbons, such as benzene rings. For positron emission tomography and radionuclide imaging, these classes include short lived radioisotopes.

Because the capillary endothelium of tumors and injured tissues exhibit high permeability rates relative to normal tissue, MCM passively diffuses into these tissues. The poorly developed or absent lymphatic system of tumors and some tissues limits the rate of movement of macromolecules out of these tissues. This combination (enhanced permeability and retention) is used during imaging of these tissues. The tumors and injured tissues are seen by imaging as a time-dependent increased intensity in the interstitial space (Mann and Brasch, supra). The prolonged retention within the vascular compartment of tumors and some injured tissues provides nearly a constant level of enhancement for more than one hour after administration.

The MCM of this invention include contrast agents attached to a large backbone. The backbone can be a protein, such as albumin, a polypeptide, such as poly-L-lysine, a polysaccharide, a dendramer, or a rigid hydrocarbon or other compound with a small molecular weight but a larger effective molecular size. The preferred backbones of this invention are compounds that when passed through a gel filtration matrix, behave similarly to a peptide of 30 kD.

This invention also encompasses MCM that is formed in vivo. A contrast medium is administered to an animal and the medium attaches to a large backbone, such as albumin or polysaccharides.

In MRI, contrast media improve the image obtained by altering $T_1$ and $T_2$ of hydrogen protons. In the presence of an external magnetic field, protons produce a weak fluctuating field which is capable of relaxing neighboring protons. This situation is dramatically altered in the presence of a strong paramagnet (such as a contrast agent). A single unpaired electron in a contrast agent induces a field which is nearly 700 times larger than that produced by protons and fluctuates with a frequency component which is in a range that profoundly affects boh the $T_1$ and $T_2$ values of nearby protons. Thus in a $T_1$-weighted imaging sequence, the paramagnetic contrast media causes the protons of nearby hydrogen nuclei to release far greater amounts of energy to reach equilibrium after a r-f pulse and appear as very bright areas in an MR image. In a $T_2$-weighted image, the protons in tissues that take up the contrast medium release less energy to reach equilibrium and appear darker in an MRI.

Normally, paramagnetic lanthanides and transition metal ions are toxic in vivo. Therefore, it is necessary to incorporate these compounds into chelates with organic ligands. Acceptable chelates include: 1,4,7,10-tetraazacyclododecane-N,N',N",N'"-tetraacetic acid (DOTA); 1,4,7,1 0-tetraazacyclododecane-N,N',N"-triacetic acid (DO3A), 1,4,7-tris(carboxymethyl)-10-(2-hydroxypropyl)-1,4,7,10-tetraazacyclododecane (HP-DO3A), and more preferably, diethylenetriaminepentaacetic acid (DPTA).

Paramagnetic metals of a wide range are suitable for chelation. Suitable metals are those having atomic numbers of 22–29 (inclusive), 42, 44 and 58–70 (inclusive), and having oxidation states of 2 or 3. Those having atomic numbers of 22–29 (inclusive), and 58–70 (inclusive) are preferred, and those having atomic numbers of 24–29 (inclusive) and 64–68 (inclusive) are more preferred. Examples of such metals are chromium (III), manganese (II), iron (II), cobalt (II), nickel (II), copper (II), praseodymium (III), neodymium (III), samarium (III), gadolinium (III), terbium (III), dysprosium (III), holmium (III), erbium (III) and ytterbium (III). Chromium (III), manganese (II), iron (III) and gadolinium (III) are particularly preferred, with gadolinium (III) the most preferred. See published PCT application WO 94/27498. Gadolinium (Gd) is a lanthanide metal with an atomic weight of 157.25 and an atomic number of 64. It has the highest thermal neutron capture cross-section of any known element and is unique for its high magnetic moment (7.98 at 298° K.). This is reflected in its seven unpaired electrons (CRC HANDBOOK OF CHEMISTRY AND PHYSICS, 75TH ED., Lide, D. R., ed., 1995).

The preferred MMCM is albumin-(Gd-DPTA)$_{30}$. Albumin-(Gd-DPTA)$_{30}$ is prepared by the method of Ogan (supra). The molecular weight of albumin-(Gd-DPTA)$_{30}$ is 92 kD. The distribution volume of albumin-(Gd-DPTA)$_{30}$ is 0.05 l/kg which closely approximates the blood volume. Plasma half life is approximately 3 hours with a delayed renal elimination over days. See, Schmiedl, U., et al., *Invest. Radiol.* 22(9):713 (1987).

Typically, the administration of contrast media for imaging tumors is parenteral, e.g., intravenously, intraperitoneally, subcutaneously, intradermally, or intramuscularly. Thus, the invention provides compositions for parenteral administration which comprise a solution of contrast media dissolved or suspended in an acceptable carrier, preferably an aqueous carrier. The concentrations of MCM varies depending on the strength of the contrast agent but typically varies from 0.1 µmol/kg to 100 µmol/kg. A variety of aqueous carriers may be used, e.g., water, buffered water, 0.9% saline, 0.3% glycine, hyaluronic acid and the like. These compositions may be sterilized by conventional, well known sterilization techniques, or may be sterile filtered. The resulting aqueous solutions may be packaged for use as is, or lyophilized, the lyophilized preparation being combined with a sterile solution prior to administration. The compositions may contain pharmaceutically acceptable auxiliary substances as required to approximate physiological conditions, such as pH adjusting and buffering agents, tonicity adjusting agents, wetting agents and the like, for example, sodium acetate, sodium lactate, sodium chloride, potassium chloride, calcium chloride, sorbitan monolaurate, triethanolamine oleate, etc.

II. Macromolecular Contrast Media Imaging of Tumors

One of skill in the art will realize that MCMI can be used by various methods, for instance MRI, CT, PET or radionuclide scanning. For example, MCM for CT scanning interrupt the X-rays used to image and appear as bright areas. Radioisotopes that accumulate in tissues appear as bright areas in PET or radionuclide scanning.

Signal intensity values (or bright areas in an image) can be obtained for every image time point from the tumor, from normal tissue, preferably the inferior vena cava (IVC) or normal muscle, and from the phantom (corn oil, water or contrast media). Preferably, 4–6 regions of interest with a minimum of 30 pixels/regions can be analyzed over several different anatomical image slices using an image analysis program, e.g., MR Vision, Menlo Park, Calif. These images can then be used to generate the dynamic signal intensity response of the tissues.

A. Magnetic Resonance Imaging of Tumors

MRI has been used to visualize tumors in situ since the 1960's (Belfi, C. A., et al., *Int. J. Oncology Biol. Phys.*

20:497 (1991). Success in imaging tumors is based on the differences between the spin-lattice relaxation time ($T_1$) and the spin-spin relaxation time ($T_2$) between malignant and normal tissue.

$T_1$ and $T_2$ are measurements of time which depend on the magnetic field and pulsing radio waves that perturb the equilibrium of the magnetic moment of hydrogen nuclei of the cells in the tissue being imaged. After stimulation by the pulsing radio waves, the nuclei, returning to their equilibrium state lose energy by emitting radio waves and by transferring energy to surrounding molecules. The process by which energy is lost to the environment is called "relaxation." Bradley, W. and Tosteson, H., in NUCLEAR MAGNETIC RESONANCE IMAGING IN MEDICINE, Kaufman, L., et al., eds., IGAKU-SHOIN, Ltd. New York, 1981.

$T_1$ is the longitudinal magnetic relaxation time, and $T_2$, the transverse magnetic relaxation time. $T_1$ measures the time it takes the sample initially to become polarized in the fixed external magnetic field. It is also the time constant of return to equilibrium in the fixed magnetic field after a radio frequency (r-f) pulse. The surrounding protons ("the lattice") absorb energy given off by other protons and dampen the oscillations of the proton caused by the r-f pulse. This dampening effect causes the sample to return to equilibrium. Therefore, $T_1$ is sometimes referred to as the "spin lattice relaxation time."

$T_2$ is a measure of how long the resonant nuclei hold the temporary transverse magnetization. It indicates the relationship between the strength of the external field and the strength of the local internal fields caused by surrounding molecules. After an r-f pulse, the protons become synchronized and begin wobbling around the axis of the magnetic field ("precess") together. However, if the protons experience locally different magnetic fields, they will precess at different frequencies, quickly getting out of phase. This dephasing causes the collective transverse magnetization to average to zero. Because the exchange of energy from one spinning proton to another spinning proton causes dephasing, the transverse magnetic relation time $T_2$ is also called the "spin-spin relaxation time."

Although other nuclei can be imaged by MRI, such as $^{19}F$ (Meyer, K. L., *Dissertation Abstracts Int'l* 53(5):2428B (1992), the preferred nuclei is $^1H$. This is the most abundant spin-bearing nucleus in the human body, being found predominantly in fat and water. The hydrogens associated with proteins and other building blocks of tissues have very short $T_2$ values and therefore do not contribute directly to the MRI signal.

The most routinely used imaging sequence is the spin-echo. Its popularity is attributable to its ability to produce images which display variations in $T_1$, $T_2$ and spin density, ρ, of tissues. The spin-echo sequence consists of 90° and 180° r-f pulses repeated every TR (repetition time of the sequence) seconds. The signal is referred to as an echo because it comes about from the refocussing of the transverse magnetization at an echo time (TE) after the application of the 90° pulse.

A $T_1$-weighted image is one in which image contrast displays differences in the $T_1$ of the tissues. A $T_1$-weighted image is produced when the spin echo sequence produces a $TR \leq T_1$ and $TE < T_2$.

A $T_2$-weighted image is one in which image contrast displays differences in the $T_2$ of the tissues. A spin-echo sequence produces a $T_2$-weighted image when $TR > T_1$ and $TE \geq T_2$.

Spin density weighting is an image where contrast displays differences in spin density of the tissues. A spin-echo sequence produces a ρ-weighted image when $TR > T_1$ and $TE < T_2$.

The goal of the MRI scientist is to maximize the contrast to noise ratio between tissues. By varying TR and TE, the clinician has a tremendous amount of flexibility to select the desired contrast between two tissues. To do so, the parameters mentioned above can be optimized or contrast agents can be utilized when MR imaging.

Many different types of tissue and tumors can be imaged by MRI, including, but not limited to, brain, mammary, and any solid tumor found in any soft tissue in the body (including liver, pancreas, ovaries, etc.) MMCM-MRI can be used to enhance the contrast of vascular structures of non-diffuse tumors, such as breast, lung, prostate, head and neck (squamous), rectal, testicular, bladder and ovarian carcinomas, soft tissue and central nervous system tumors and multiple myelomas.

For in vivo measurements, the tumor or tissue host is typically placed within a radiofrequency coil with an external intensity standard, preferably a 5 mm diameter tube filled with corn oil, water or contrast media. This is referred to as the "phantom" and is used to correct for instrument anomalies. Various types of images can be obtained. Two types of images are three-dimensional spoiled gradient and two-dimensional spin warp proton. The images can be $T_1$-weighted, $T_2$-weighted or ρ-weighted. Images can obtained through sections of the tumor with a TR of from 200 msec to 50 msec and a TE of 6 msec to 1 msec. The thickness of each section can be from 1 to 5 mm with 2 to 3 mm being preferable, the field of view can be from 50×50 mm to 100×100 mm in a two dimensional image to 40×40× 40 mm to 100×100×50 in a three dimensional image. The data matrix of a three dimensional image can range from 100×100×5 to 200×200×256. The total image acquisition time can range from 0.5 to 2 minutes (van Dijke, supra). See also, Cohen, F.M., et al., *Investigative Radiology* 29(11):970 (1994)).

In a preferred embodiment, the tumor hosts being imaged are placed supine within a radiofrequency coil of ±10–30 G/cm, preferably ±20 G/cm. $T_1$-weighted axial single section images are obtained with the following settings: repetition times of 2000–50 msec, an echo time of 1–2 msec, preferably 1.4 msec, a field-of-view of about 50×50×16 mm, a pixel matrix of 1200–1300, preferably 1282, and an effective slice thickness of 1–5 mm, preferably 2–3 mm.

Those of skill in the art will recognize that MRI can be performed with various parameters depending in part, on the location of the tumor being imaged and the particular MRI apparatus being utilized.

It is important for clear imaging that the host remain still during the imaging process. Animal test subjects usually must be anesthetized. It may be necessary to anesthetize small children as well. In any event, the area to be imaged must be secured so that it does not move during the imaging process.

From the description above, one of skill can appreciate that MCM can be used to determine the leakiness of tumor microvessels by the accumulation of MCM into the interstitial space of the tumor over time.

B. Determination of Microvascular Permeability

To determine the microvascular permeability of a tumor, a kinetic model of microvessel "leakiness" is generated. Curve fittings algorithms are used to find the change in relaxation rates of the imaged tissues before and after MCM administration. For example, in MR imaging, from the change in relaxation rates, parameters important to determining the microvascular permeability are determined. Pre-contrast relaxation rates ($R_1$) ($1/T_1$) estimates for normal tissue and tumor are obtained by curve fittings based on more than two, preferably 5 unenhanced three dimensional image sets with TR's varying from 50 msec to 2000 msec. Postcontrast $R_1$ values are calculated based on signal intensity and knowledge of precontrast values. The precontrast $R_1$ for each response is then subtracted from the postcontrast $R_1$ to obtain the change in the longitudinal relaxation rate, $\Delta R_1$, at all postcontrast time points. $\Delta R_1$ is taken to be directly proportional to the local paramagnet concentration in a tissue.

Again, in MR imaging, the functional characteristics, fractional blood volume (fBV), fractional leak rate (FLR), fractional reflux rate (FRR), and permeability surface area product (PS), which is directly related to the microvascular permeability, are estimated from the $\Delta R_1$ data. One model used to analyze the $\Delta R_1$ data obtained from the vena cava and tumor is shown in FIG. 1. In FIG. 1, the kinetics of MMCM disappearance from the blood following bolus intravenous injection is described by a single compartment, the inferior vena cava (IVC). The turnover rate of contrast media is k and the initial condition of the IVC is IC (before the addition of contrast media). The tumor model is composed of two compartments, tumor blood (B) and tumor interstitial water (IW). The kinetics of fractional transport of MCM from B to IW is designated the FLR and from IW to B as FRR. As described above, the leakiness of the tumor microvasculature allows MCM to accumulate in the interstitial space of the tumor. The fPV of the tumor is a proportionality constant, determined by the size of the tumor. In one embodiment, four parameters of the model (k, IC, FLR, FRR and fPV) are fitted to the $\Delta R_1$ data from the IVC and from the tumor using the SAAM II program (SAAM Institute, Seattle WA). In another, more preferred embodiment, a linear regression analysis is used to compare the slopes of tissue and blood responses to MMCM to determine microvascular permeability.

Microvascular permeability can be estimated as the product of fBV (after correction for hematocrit to yield an estimate of the plasma volume of the tissue) and FLR. The figure obtained is then multiplied by 60 to convert to hours.

Various different statistical analyses can be done to correlate the microvascular permeability results obtained by imaging to the histological results obtained by the S-B-R system, i.e., a high microvascular permeability value is indicative of malignancy and a low microvascular permeability value is indicative of benign status. A preferred method is the two-tail, paired t-test. For this analysis, a correlation value of greater than 0.70, preferably greater than 0.80 with a probability of correlation of preferably less than 0.05 is assigned statistically significant.

We found that tumors with a permeability value of 0 were benign or were determined to be the lowest grade of malignancy by the S-B-R grading system. Tumors with a permeability value of 0.01 to 0.05 corresponded with tumors of moderate grade malignancy. Tumors with a permeability value greater than 0.05 corresponded to high grade tumors, however there was some overlap in permeability values between the moderate and high grade tumors.

III. Grading of Tumors

An aspect of this invention is the comparison of the permeability values of the tumors to the histopathologic grade of the tumors to create a standard value, values or curve that can be generally applied to a variety of tumors. To accomplish this, a number of tumors of different grades of malignancy are examined histopathologically and a comparison of the histopathology to the microvascular permeability made to generate standards.

A. Histopathologic Analysis of Tumors

Histological evaluation of tumors consists of the removal of cells from the host, and examining the cells for structural features. The cells can be fixed in a formaldehyde solution prior to examination. In addition, the cells may be embedded in paraffin and sliced prior to examination. For enhanced viewing of certain cellular structures, the cells may be stained with a chemical stain or by immunological staining.

1. Tumor Cell Fixation

In one embodiment, angiogenesis is measured by fixing and staining individual tumor cells and examining them microscopically for structures indicative of newly formed vasculature. Tumor cells can be removed from the host animal through a needle biopsy wherein a small sample of the tumor is removed for analysis or through surgical biopsy wherein the entire tumor is removed from the host animal. Alternatively, if the tumor is readily accessible, the entire tumor can be excised or tumor cells scraped off with a scalpel or other instrument capable of removing cells.

Once the cells are removed from the host animal, they can either be fixed in solutions well known in the art prior to embedding, or they can be frozen in liquid $N_2$ and embedded directly without fixation. An incomplete list of fixation solutions include: buffered formal saline (10% formalin, 150 mM NaCl, pH 7.0); B5 fixative (mercuric chloride-formalin mixture); 8% glutaraldehyde; 2.5% osmium tetroxide; paraformaldehyde; and more preferred, formalin (37% formaldehyde) (all are available from Sigma Chemicals, St. Louis, Mo.).

2. Tumor Cell Staining

After the cells have been fixed, they are embedded in a solid support which can be sliced thinly, e.g., 2–5 $\mu$m. Embedding media are well known in the art. The most common embedding media for light microscopy is paraffin and compounds containing paraffin, however other media, such as Araldite®, Durcupan®, glycol methacrylate, and hydroxypropyl methacrylate as well as other appropriate media can be used.

After fixation, the tumor sections are stained to better identify cellular structures. For example, to assay for angiogenesis based on microvascular density, the number of endothelial clusters are viewed by staining the sectioned tumor with labeled antibodies to von Willebrand's factor and/or Factor VIII or other proteins, including acidic fibroblastic growth factor, angiogenin, basic fibroblastic growth factor, heparinase, interleukin-8, placenta growth factor, platelet-derived endothelial growth factor, prostaglandins $E_1$ and E2 and tumor necrosis factor-$\alpha$, all of which are highly specific for endothelial cells or are stimulators of angiogenesis. See, Brasch, R. C., *Diaginostic Imaging*, June 1996, p73. In another embodiment, sectioned tumors are immunostained with antibodies to vascular endothelial growth/ permeability factor (VEGF, PF) to measure the angiogenic activity of the tumor. See, Strugar, J. F., et al, *J. Neurosurg.* 83:682 (1995).

Cells that are to be analyzed by the S-B-R system for tumor malignancy are examined for three types of structures: (1) mitotic structures; (2) anaplasia, or nuclear pleomorphism; and (3) ductoglandular differentiation. The presence and/or absence of these structures determines the degree of differentiation exhibited by the tumor cell. A well differentiated cell (e.g., normal breast tissue cell) is considered non-malignant and given a low S-B-R score. An undifferentiated cell or a cell which contains indices of frequent mitosis is considered malignant and given a high S-B-R score.

It is necessary to stain the tumor sections to be examined microscopically so that the structural elements indicative of malignancy are evident. A preferred cellular stain is hematoxylin and its counterstain, eosin (Howell, L. P., et al, *Am J. Clin. Pathol.* 101:262 (1994)). Hematoxylin preferentially stains nuclear structures. In addition to chemical stains, immunological stains have been used to determine the presence of differentiation factors which may indicate the degree of malignancy of the cells. Other stains used in light microscopy are well known in the art and can be used if desired.

For immunological staining, the label conjugated to the antibody which binds to the structural elements is typically an enzyme that reacts with a specific substrate (i.e., alkaline phosphatase or β-galactosidase), a fluorophore, a radioisotope or any number of compounds known to those of skill which afford increased visibility of microscopic structures.

3. Analysis of Tumor Cells by the S-B-R Grading System

To prepare a comparison between the accepted S-B-R grading system and the microvascular permeability as measured by imaging techniques, imaged tumors are examined by the S-B-R grading system. In a preferred embodiment, either the entire tumor or a portion is removed and frozen in liquid $N_2$. The tumor then is fixed in formalin, preferably 5–20%, most preferably 10%, embedded in an embedding media, preferably paraffin and sectioned in the same plane as the MRI images, to the desired thickness with a microtome, preferably about 5 –100 μm, most preferably 5 μm. See, van Dijke, supra.

IV. Systems and Kits

It is anticipated that the method of grading tumors can be incorporated into a commercial kit or system for grading certain types of tumors. The kit would incorporate a system wherein an algorithm is used to assign a grey scale to the regions of interest from the permeability values collected from the imaging. The grey scale values could be combined to form an image wherein the regions of interest which accumulated the most MCM would appear the brightest. The combined grey scale image could then be compared to previously obtained controls that had been correlated with histopathologic grade to grade the tumor being imaged.

In a preferred embodiment, the algorithm performs a simple linear regression analysis. The data analyzed are the slopes of response of both tissue and blood to MMCM. In other words, the permeability over time is plotted. The slope of the permeability of the tissue is compared to the slope of the permeability of blood. If the slopes are the same, the tissue is not more permeable to MMCM than blood and likely is not pathogenic. If the slope is greater than the slope of blood, the degree of difference is proportional to the degree of malignancy. A simple statistical analysis can then be done, assuming the null hypothesis is no difference in slopes, to determine the confidence level of the analysis. If the null hypothesis is rejected because p<0.05, the reciprocal of this p value can be calculated and presented as a simple grey scale superimposed on the image. Thus, the more unlikely the null hypothesis in a given pixel or group of pixels, the brighter the pixel or group of pixels.

In addition to the algorithm and instructions for use, the kit may contain MCM needed to enhance the image of the tumor.

The following examples are offered to illustrate, but not to limit the claimed invention.

V. EXAMPLES

A. Example 1

Induction of Breast Tumors in Rats

1. N-ethyl-N-nitrosurea

N-ethyl-N-nitrosurea (ENU) is an alkylating agent and a potent carcinogen that induces tumors of varying grade and location in rats, depending on the site of injection, the dose, the age and the sex of the rat (Mandybur, T. I., et al., *Radial. Res.* 101(3):460 (19850. Mammary cells are the primary target cells when 45–180 mg/kg ENU is administered intraperitoneally into 30 day old female rats (Stoica, G., et al., *Anticancer Res.* 11(5):1783 (1991). Pharmacologically, ENU acts without the necessity of enzymatic activation on cellular targets including DNA, various species of RNA and a variety of proteins. The histologic spectrum of induced mammary tumors using this model has been shown to be similar to the spectrum of histologies encountered in humans (Stoica, supra). Following a single intraperitoneal administration of 180 mg/kg ENU, malignant breast tumors develop in up to 100% of rats after an average of 92 days. At lower doses of 45 mg/kg approximately 42% of the rats developed fibroadenomas (Stoica, supra). For this study ENU (Sigma Chemicals, St. Louis, Mo.), was dissolved shortly before administration in sterile saline to a concentration of 10 mg/mL.

2. Animals

Fifty 30-day-old female Sprague Dawley rats were randomly divided in two groups. One group (n=35) received a single intraperitoneal dose of 45 mg/kg ENU and the other group (n=15) received 180 mg/kg ENU intraperitoneally. Animals were observed daily for tumor development. When tumors became apparent, tumor growth was allowed until the tumors reached a diameter of 1–1.5 cm. Criteria for elimination of animals from the study were as follows: 1) no visible tumor observed within 160 days; 2) no visible tumor in the mammary fat pad; and 3) animal demise.

3. Results

Fourteen of the 15 rats (93%) in the high ENU dose group (180 mg/kg) and of the 35 rats (57%) of the low dose group (45 mg/kg) developed mammary tumors. Two rats were eliminated because of non-mammary tumors, a synovial sarcoma and an undifferentiated limb sarcoma. Fourteen rats did not develop any tumor by 180 days after ENU administration. The 34 mammary tumors covered a broad spectrum of pathology from benign to highly malignant. See Table 1. The lower ENU dose tended to induce more benign tumors and vice versa.

Before MRI, the animals were anesthetized by an intraperitoneal injection of 50 mg/kg pentobarbital. A 23G butterfly cannula (Abbott Laboratories, North Chicago, Ill.) was inserted in a tail vein for contrast medium injection. After completion of imaging procedures, the animals were killed and tumors were removed for histological analysis.

B. Example 2

Magnetic Resonance Imaging

MR imaging was performed using a 2.0 Tesla system (Omega CSI-II; Bruker; Fremont, Cailf.). The anesthetized rats described in Example 1 were placed supine within a "bird-cage" radiofrequency coil (inner diameter 4.5 cm, length 7.6 cm).

Axial $T_1$-weighted 3D-spoiled gradient recalled (SPGR) sequences were obtained using the following settings: repetition times (TR) of 2000–50 msec, an echo time (TE) of 1.4 msec, one acquisition, a field-of-view of 50×50×16 mm, a 1282 pixel matrix and an effective slice thickness of 2 mm. Precontrast SPGR sequences included multiple TR of 50–2000 msec for calculating baseline relaxation rates ($R_1$= $1/T_1$) Dynamic postcontrast images were performed with TR fixed at 50 msec. Albumin-$(Gd-DTPA)_{30}$ (0.03 mmol Gd/kg), randomly ordered, was injected via the tail vein. Three precontrast and 30 postcontrast images were acquired during 1 hour at 2 minutes intervals.

1. Results

Qualitatively, benign tumors were noted to enhance uniformly throughout following administration of MMCM, consistent with the absence of necrosis on histology. All malignant tumors showed a strong enhancement of the periphery or rim; however, the enhancement response of the tumor center varied from weak to strong, apparently as a function of central tumor necrosis.

Figure 2:
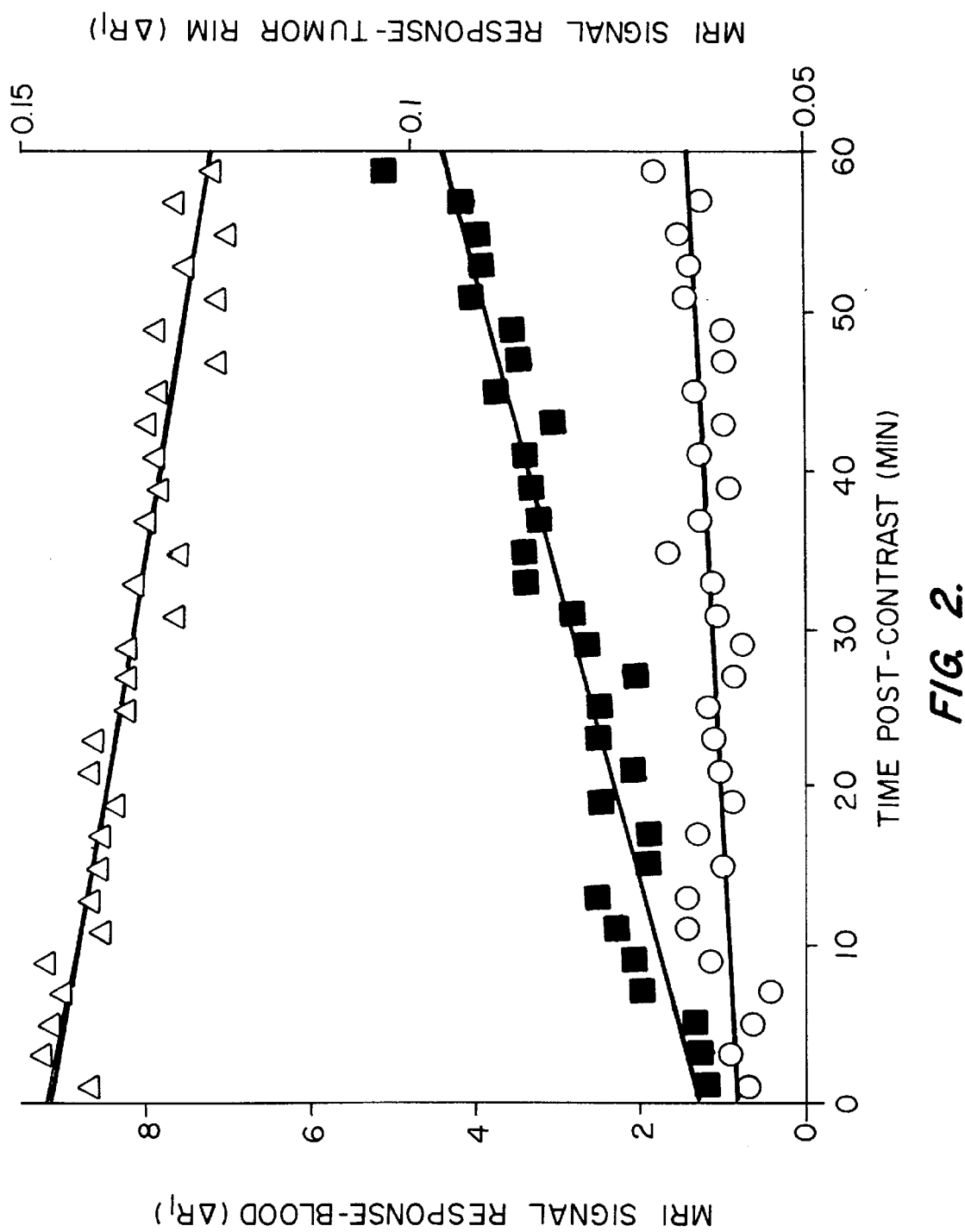
FIG. 2 is a chart indicating the permeability of tumors as a finction of time. As can be seen the signal enhancement of benign tumors paralleled the response of blood in the vena cava. However, the signal enhancement of malignant tumors tended to increase over time.

Following administration of the macromolecular albumin-(Gd-DTPA)$_{30}$, two dynamic patterns of tumor signal enhancement were observed. In some cases the tumor response tended to decrease over 60 minutes and to parallel the response of blood in the vena cava; this response corresponded histologically to benign tumors (FIG. 2). The tumor enhancement for malignant tumors, relative to blood signal, was noted to increase over time (FIG. 2).

C. Example 3

Histological Analysis

After the animals were sacrificed, all tumors were removed, fixed in 10% formalin, embedded in paraffin and sectioned in the same plane as the MR-images. Hematoxylin-eosin staining was performed for histological analyses. Tumors were graded for level of malignancy using the S-B-R method (Le Doussal, supra). For this method each tumor is assigned from 1 to 3 points in each of the three categories, structures counted at 10 high power fields at the most mitotic active area using a field diameter of 0.44 mm. The lowest score possible, even for a benign tumor, is 3. The highest score, indicative of a poorly differentiated malignancy, is 9.

Figure 3:
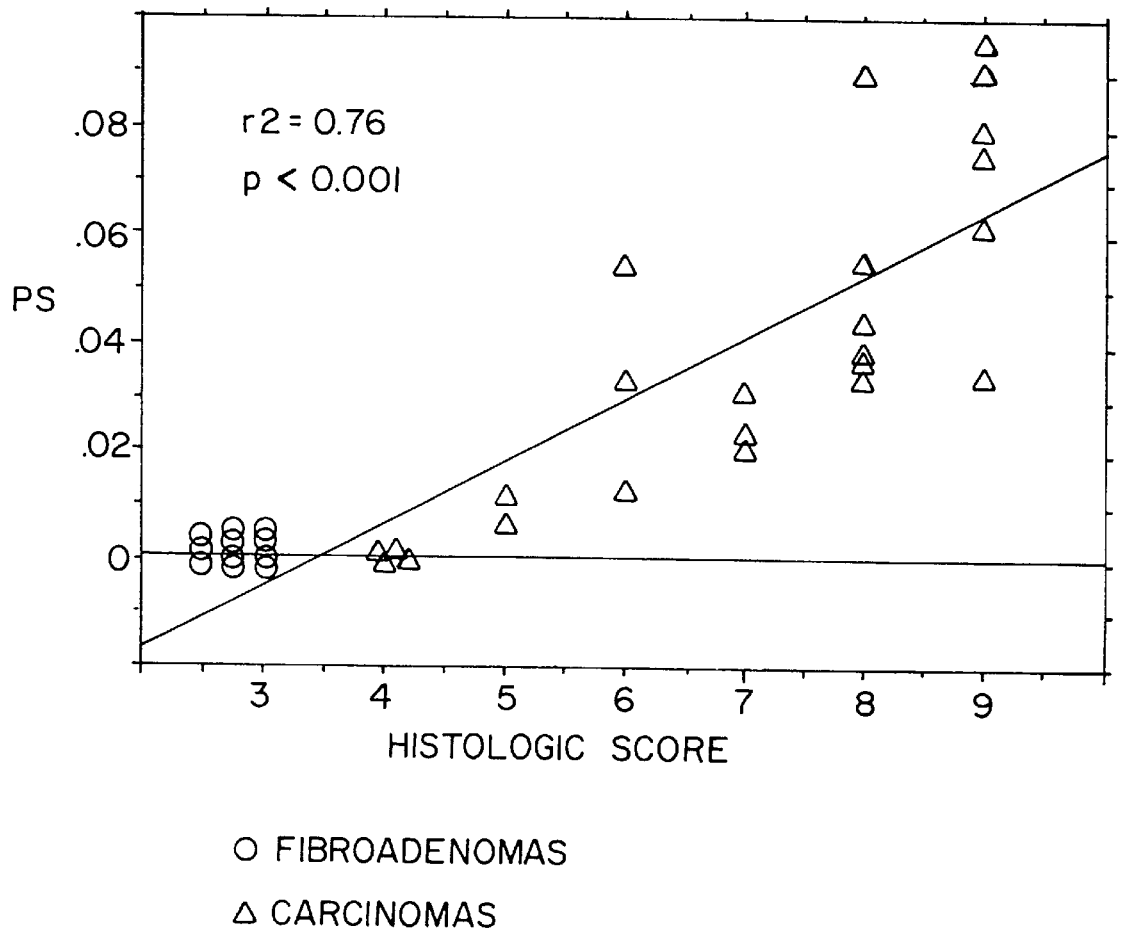
FIG. 3 is a chart comparing the permeability values (PS) versus the S-B-R histopathologic grade of mammary tumors including both fibroadenomas and carcinomas after albumin-(Gd-DPTA)$_{30}$ administration in 47 rats.

All benign tumors were diagnosed as fibroadenomas with variable amounts of fibrous and adenomatous tissue. All carcinomas were intraductal adenocarcinomas. Histologic analysis using the S-B-R score resulted in the following classification: benign fibroadenomas (FIG. 3) and low grade carcinomas (S-B-R=3–5; FIG. 3) demonstrated more than 75% of ductoglandular formations within the tumor, nuclei with minimal variation in size and shape and five or less mitotic figures, counted at 10 high power fields at the most mitotic active area using a field diameter of 0.44 mm. Both histologic entities could be only differentiated by minimal invasion of the carcinomas. High grade carcinomas (S-B-R=8–9) demonstrated less than 10% of ductoglandular formations within the tumor, nuclei with marked variation in size and shape and more than 11 mitotic figures at 10 high power fields. Moderate grade carcinomas (S-B-R 6–7) showed patterns in between low and high grade carcinomas.

D. Example 4

Comparison Between MR Imaging of Microvascular Permeability of Tumors and Histological Staining Average signal intensities (SI) for the whole tumor, the tumor rim and blood within the vena cava were measured in the central section in two to four operator-defined regions-of-interest (ROI; minimum of 30 pixels/region). $R_1$ precontrast ($R_1$pre=$1/T_1$pre) was calculated from signal intensities of ROIs in a set of preliminary 3D-SPGR images obtained with TR values of 50, 100, 200, 400, 800 and 2000 msec. These values were fit to Equation 1 with $M_o$ being the external magnetic field strength.

$$SI = M_o(1 - e^{(-TR/T_1)}) \tag{1}$$

$R_1$ postcontrast ($R_1$post=$1/T_1$post) was calculated from the measured signal increase in each ROI using equation 2:

$$R_1\text{post} = (1/TR)\ln(1-(1-e^{(-TR \cdot R_1^{pre})})) \tag{2}$$

The changes in the relaxation rate ($\Delta R_1 = 1/T_1\text{post} - 1/T_1\text{pre}$), which were assumed to be directly proportional to the gadolinium concentration, were used for the kinetic analysis.

Kinetic analysis of tumor enhancement responses was limited to the tumor rim; the tumor rim is typically the most vascularized and least necrotic region and is less subject to elevated interstitial pressure, which is a primary determinant of drug distribution in the tumor center (Jain, supra). Furthermore, previous MRI tumor studies have shown the tumor rim to be the region most representative of viable tumor tissue (van Dijke, supra) and the most responsive to chemotherapy (Aicher, K. P., et al., *Cancer Res.* 50(22):7376 (1990)), radiotherapy (Cohen, F. M., et al., *Invest. Radiol.* 29(11):970 (1995)) and angiogenesis inhibition. Blood $\Delta R_1$ data were fitted to a monoexponential decay for tumors imaged in the presence of albumin-(Gd-DTPA)$_{30}$. Tissue $\Delta R_1$ data were fitted to a bidirectional, 2-compartmental (albumin-(Gd-DTPA)$_{30}$) kinetic model. Using SAAM-computer software (McGuire, R. A. and Berman, M., *Endocrinology* 103(2):567 (1978)), a modification of the Renkin-Crone equation was applied to $\Delta R_1$ data to derive tumor permeability surface area product (PS) measurements (Shames, D.M. et al., *Magn. Res. in Med.* 29:616 (1993)) and the data extrapolated to time zero to derive the fractional blood volume (Schwickert, H. C., et al., *Radiology* 198:893 (1996)).

1. Statistics

Statistical analysis was performed using a "statistical analysis system"(SAS) software package with an IBM 4043 computer. Statistical significance was assigned if p<0.05.

2. Results

Kinetic analysis of the dynamic $\Delta R_1$ data from tumor rim and blood using a two-compartmental bidirectional model yielded estimates of blood volume (BV) and permeability surface area product (PS). For each contrast medium, these MRI-derived physiological parameters were examined for differences between benign and malignant tumors and for correlations with the S-B-R histologic score.

a. Blood Volume

Figure 4:
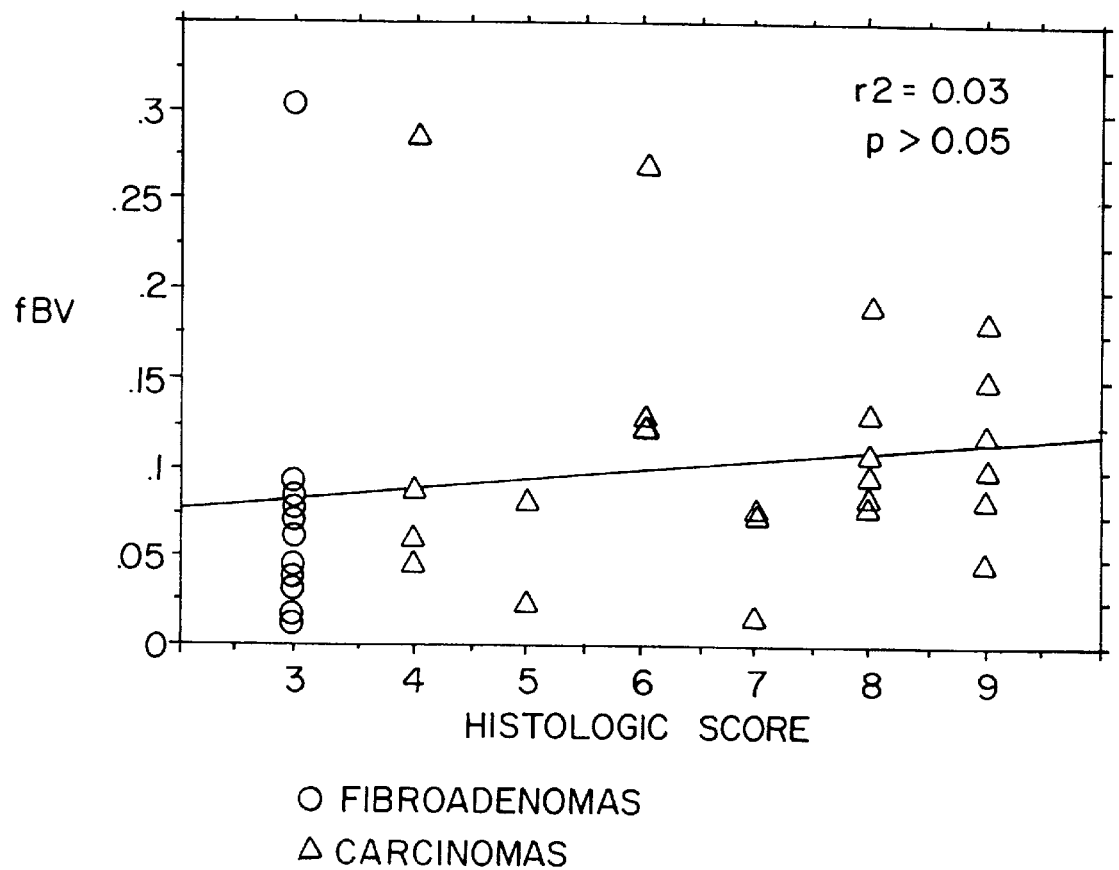
FIG. 4 is a chart comparing tumor blood volume versus the S-B-R histopathologic grade for fibroadenomas and carcinomas. Studies were performed with albumin-(Gd-DTPA)$_{30}$.

With respect to fractional blood volume (fBV) estimates, no significant difference was observed between benign and malignant tumor groups with either contrast medium (p>0.05), although there was a tendency for higher blood volumes in malignant tumors (FIG. 4).

b. Tumor Microvascular Permeability

Analysis of albumin-(Gd-DTPA)$_{30}$ data showed a significant difference in mean PS products between benign tumors and carcinomas (p>0.05). All 10 benign tumors had PS products of zero, while the PS values in 24 carcinomas ranged from zero to 0.09 mL/cm$^3$ h (Table 1).

Albumin-(Gd-DTPA)$_{30}$ derived PS values correlated strongly with histologic tumor grade ($r^2$=0.76; p<0.001, Table 1). Some overlap in PS values was observed for benign tumors and low grade carcinomas with no measurable macromolecular permeability. However, a macromolecule hyperpermeability was exclusively found in carcinomas. Thus, microvascular permeability as measured by PS values correlated well with malignancy.

TABLE 1

Specificity of Albumin-(Gd-DTPA)$_{30}$ MRI for
Breast Tumor Differentiation
by Quantitative Estimates of Microvascular Permeability

| | | Albumin-(Gd-DPTA)$_{30}$ | |
|---|---|---|---|
| Histology | Grade | PS < .005 | PS > .005 |
| Benign Tumors | 3 | 10/10 | 0/10 |
| Carcinomas | | 5/24 | 19/24 |
| low grade | 4–5 | 5/6 | 1/6 |
| moderate gr. | 6–7 | 0/6 | 6/6 |
| high grade | 8–9 | 0/12 | 12/12 |

TABLE 2

Comparison of Permeability Values and S—B—R
Histopathologic Grade

| Rat Number | S—B—R Grade | Permeability Value |
|---|---|---|
| ENU-1 | 7 | .0239 |
| ENU-2 | 5 | .0032 |
| ENU-3 | 4 | .0000 |
| ENU-4 | 4 | .0000 |
| ENU-5 | 6 | |
| ENU-6 | 6 | .0440 |
| ENU-7 | 4 | |
| ENU-8 | 3 | .0000 |
| ENU-9 | 8 | |
| ENU-10 | 8 | |
| ENU-11 | 9 | .0798 |
| ENU-12 | 6 | .0134 |
| ENU-13 | 8 | .0902 |
| ENU-14 | 5 | |

What is claimed is:

1. An imaging method of determining the pathologic grade of a tumor in situ, said method comprising:
   (i) administering a macromolecular contrast medium to an animal;
   (ii) imaging the change over time in the signal intensity in the tumor and in blood to obtain dynamic signal intensity responses from both the tumor and the blood;
   (iii) applying the dynamic signal intensity responses of step (ii) to a kinetic model to calculate tumor microvascular permeability; and
   (iv) determining the pathologic grade of the tumor from the microvascular permeability of the tumor from a standard curve of permeability values.

2. The method of claim 1, wherein the imaging step is magnetic resonance imaging.

3. The method of claim 1, wherein the tumor is a mammary tumor.

4. The method of claim 3, wherein said mammary tumor is an adenocarcinoma.

5. The method of claim 1, wherein the administering of macromolecular contrast medium is parenteral.

6. The method of claim 5, wherein the administering is via venipuncture.

7. The method of claim 1, wherein the macromolecular contrast medium is a macromolecular MRI contrast medium.

8. The method of claim 1, wherein the macromolecular contrast medium is selected from the group consisting of iron oxide particles, nitroxides, paramagnetic metal chelates and iodinated organic chemical compounds.

9. The method of claim 8, wherein the macromolecular contrast medium comprises gadolinium (III) ion.

10. The method of claim 8, wherein the macromolecular contrast medium further comprises at least one chelating group.

11. The method of claim 10, wherein the chelating groups are DPTA.

12. The method of claim 8, wherein the macromolecular contrast medium further comprises a backbone of large molecular size selected from the group consisting of proteins, polypeptides, polysaccharides, dendramers and rigid hydrocarbons.

13. The method of claim 8, wherein the macromolecular contrast medium is formed in vivo.

14. The method of claim 12, wherein the backbone is albumin.

15. The method of claim 14, wherein the macromolecular contrast medium further comprises at least 1 unit of Gd-DPTA attached to albumin.

16. The method of claim 14, wherein the macromolecular contrast medium is albumin-(Gd-DPTA)$_{30}$.

17. The method of claim 1, wherein the changes in signal intensities are used to calculate the accumulation of macromolecular contrast medium within the tumor.

18. The method of claim 1, wherein the microvascular permeability of the tumor is correlated to the histopathologic grade of the tumor.

19. The method of claim 18, wherein the histopathologic grade of the tumor is determined by the Scarff-Bloom-Richardson grading system for malignancy.

20. The method of claim 18, wherein the pathologic grade determines malignancy or non-malignancy.

21. The method of claim 18, wherein the microvascular permeability is determined by changes in the relaxation rate of tumor and blood before and after macromolecular contrast medium is administered.

22. The method of claim 18, wherein the correlation value is greater than about 0.75.

23. The method of claim 22, wherein the probability of correlation is less than about 0.05.

* * * * *